United States Patent [19]

Sprague et al.

[11] Patent Number: 4,663,738
[45] Date of Patent: May 5, 1987

[54] HIGH DENSITY BLOCK ORIENTED SOLID STATE OPTICAL MEMORIES

[75] Inventors: Robert A. Sprague, Saratoga; John C. Urbach, Portola Valley, both of Calif.

[73] Assignee: Xerox Corporation, Stamford, Conn.

[21] Appl. No.: 678,145

[22] Filed: Dec. 4, 1984

[51] Int. Cl.⁴ .............................................. G11C 11/42
[52] U.S. Cl. ....................................... 365/127; 365/234
[58] Field of Search ................ 365/120, 121, 122, 124, 365/10, 234, 127; 250/216, 578, 237 R

[56] References Cited

U.S. PATENT DOCUMENTS

| | | | |
|---|---|---|---|
| 3,555,987 | 1/1971 | Browning | 354/227.1 |
| 3,593,318 | 7/1971 | Browning | 365/117 |
| 3,631,409 | 12/1971 | Buchan | 365/127 |
| 3,676,864 | 7/1972 | Maure et al. | 365/127 |
| 3,765,749 | 10/1973 | LaMacchia | 350/360 |
| 3,887,906 | 6/1975 | Minnaja | 365/122 |
| 3,899,778 | 8/1975 | Roberts | 365/127 |
| 4,425,501 | 1/1984 | Stauffer | 250/216 |

OTHER PUBLICATIONS

Opto-Logic Corporation, product brochure, "Slide Programmed Optical Processor Kit," Apr. 17, 1974.

Quadri Corporation, preliminary product brochure, "Model 401-22 Optical Read Only Memory".

Jackson, A. S., Compcon, (pre-presentation paper) "A New Approach to Utilization of Opto-Electronic Technology," Feb. 1974.

Primary Examiner—James W. Moffitt

[57] ABSTRACT

A block oriented solid state optical memory having a distributed data storage architecture comprises a lens array including a plurality of laterally separated lenslets which have numerical apertures selected to cause them to focus essentially diffraction limited images of a photoemitter array in parallel onto laterally displaced sections of a data mask, so that the images optically align with respective photosensors. The lenslets are formed on the first surface of the lens array, and the data mask is supported on or very close to the last surface of the lens array to minimize the scattering of reflected light. An opaque light shield on the first surface of the lens array optically masks the area between the lenslets to eliminate unwanted stray light. Furthermore, in at least some embodiments of the invention, the light shield extends into the apertures of the lenslets to stop them down sufficiently to obtain substantially diffraction limited performance.

10 Claims, 3 Drawing Figures

HIGH DENSITY BLOCK ORIENTED SOLID STATE OPTICAL MEMORIES

FIELD OF THE INVENTION

This invention relates to block oriented solid state optical memories having distributed data storage architectures and, more particularly, to improved means for optically addressing data stored in such memories. As a matter of definition, these memories are "block oriented" because the data stored therein is selectively addressable in multi-bit blocks, and they have "distributed data storage architectures" because the bits of each of those blocks are stored in spatially distributed memory sectors.

BACKGROUND OF THE INVENTION

A copending and commonly assigned United States patent application of Robert A. Sprague, which was filed Dec. 4, 1984 under Ser. No. 678,199 on a "Distributed Data Storage Architecture for Block Oriented Solid State Optical Memories", discloses a block oriented solid state optical memory in which the bits of each of the optically addressable data blocks are stored in spatially distributed memory sectors. That is a fundamental departure from the solid state optical memories which others are known to have proposed because those memories utilized a "concentrated page storage architecture," whereby each page or block of data is concentrated within a single, optically addressable memory "sector", so that it may be retrieved on demand by selectively illuminating or "addressing" just that one sector. See, for example, U.S. Pat. Nos. 3,676,864, which issued June 29, 1970 on an "Optical Memory Apparatus"; 3,765,749, which issued May 23, 1972 on an "Optical Memory Storage and Retrieval System"; and 3,899,778, which issued Aug. 12, 1975 on "Means Employing a Multiple Lens Array for Reading From a High Density Optical Memory Storage."

In view of the coined descriptors which have been adopted to provide convenient names for the above-described storage architectures, it may be helpful to note that the phrases "block of data" and "page of data" are used herein more or less interchangeably. Some of the prior art refers to the storage of optically addressable "pages," so it has been characterized as suggesting a concentrated page storage architecture. Similar terminology could be used to describe the general organization of the data stored in a memory embodying this invention, but the preferred terminology provides a more generic description which literally applies to all cases, including one wherein each optically addressable data block comprises a plurality of electrically addressable data segments. Since such data segments might be characterized as being separate "pages of data" as that phrase is normally used in the data processing field, alternative terminology has been adopted to prevent any confusion.

One of the principal advantages of a distributed data storage architecture is that it increases the tolerance of block oriented solid state optical memories to localized internal optical defects, which commonly are caused by dust particles and other foreign matter that are inadvertantly or unavoidably embedded in such memories during their fabrication or use. Gross optical defects are avoided relatively easily by exercising reasonable care during the manufacture and maintenance of such a memory, but it is economically and technically unrealistic to insist upon optical perfection. Accordingly, solid state optical memories are likely to contain relatively small localized internal optical defects which optically mask, in whole or part, some of the bits stored therein.

The practical consequences of such optical defects are more significant for memories having high bit densities, such as miniaturized units and larger, high capacity units, than for those that have more modest bit densities. Indeed, there are existing error correction techniques to adequately correct for isolated bit errors and for short and infrequent burst errors, so the limiting effect of the optical defects is not fully realized until the bit density is increased sufficiently to cause their optical masking effect to produce excessively long and/or frequent burst errors in the data read out from the memory. The bit density at which that occurs is dependent on a number of variables, including the optical quality control standards applied duing the memory manufacturing process, the cleanliness of the environment in which the memory is used, and the sophistication of any error correction procedure that is employed. However, it will be evident that a memory having a concentrated page storage architecture reaches that limit at a much lower bit density than a comparable memory having a distributed data storage architecture.

Due to the technical superiority of a distributed data storage architecture for block oriented solid state memories, the goal now is to more fully realize the potential of the technology. It has been shown that such a memory may include a shadow mask or the like for geometrically projecting images of an array of photoemitters in parallel onto spatially displaced sections of a data mask which, in turn, are optically aligned with respective photosensors. That optically partitons the memory so that it has a plurality of spatially distributed memory sectors and optically subdivides each of the sectors into a plurality of selectively illuminable or "addressable" memory cells. Furthermore, a compatible data storage strategy has been developed for mapping the bits of multi-bit data blocks onto the data mask, so that the bits of each data block occupy the memory cells which are illuminable or "optically addressable" by a respective one of the photoemitters.

As will be appreciated, the maximum permissible bit storage density of a memory of the foregoing type is limited by the resolution with which the photoemitter array is imaged onto the data mask. Indeed, in view of the increased tolerance of such memories to localized internal optical defects, the resolution limit generally determines their maximum permissible bit storage density/memory sector. Some increased imaging resolution might be achieved relatively straightforwardly, such as by substituting more or less conventional imaging lenses for the apertures of the aforementioned shadow mask, but a carefully optimized imaging system is required to fully realize the advantages of the distributed data storage architecture.

SUMMARY OF THE INVENTION

In accordance with the present invention, a block oriented solid state optical memory having a distributed data storage architecture comprises a lens array including a plurality of laterally separated lenslets which have numerical apertures selected to cause them to focus essentially diffraction limited images of a photoemitter array in parallel onto laterally displaced sections of a data mask. The lenslets are formed on the first surface of the lens array, and the data mask is supported on or very close to the last surface of the lens array to minimize the scattering of reflected light. An opaque light shield on the first surface of the lens array optically masks the area between the lenslets to eliminate unwanted stray light. Furthermore, in at least some embodiments of the invention, the light shield extends into the apertures of the lenslets to stop them down sufficiently to obtain substantially diffraction limited performance.

BRIEF DESCRIPTION OF THE DRAWINGS

Still other features and advantages of this invention will become apparent when the following detailed description is read in conjunction with the attached drawings, in which.

DETAILED DESCRIPTION OF THE ILLUSTRATED EMBODIMENT

While the invention is described in some detail hereinbelow with specific reference to a single illustrated embodiment, it is to be understood that there is no intent to limit it to that embodiment. On the contrary, the aim is to cover all modifications, alternatives and equivalents falling within the spirit and scope of the invention as defined by the appended claims.

Figure 1:
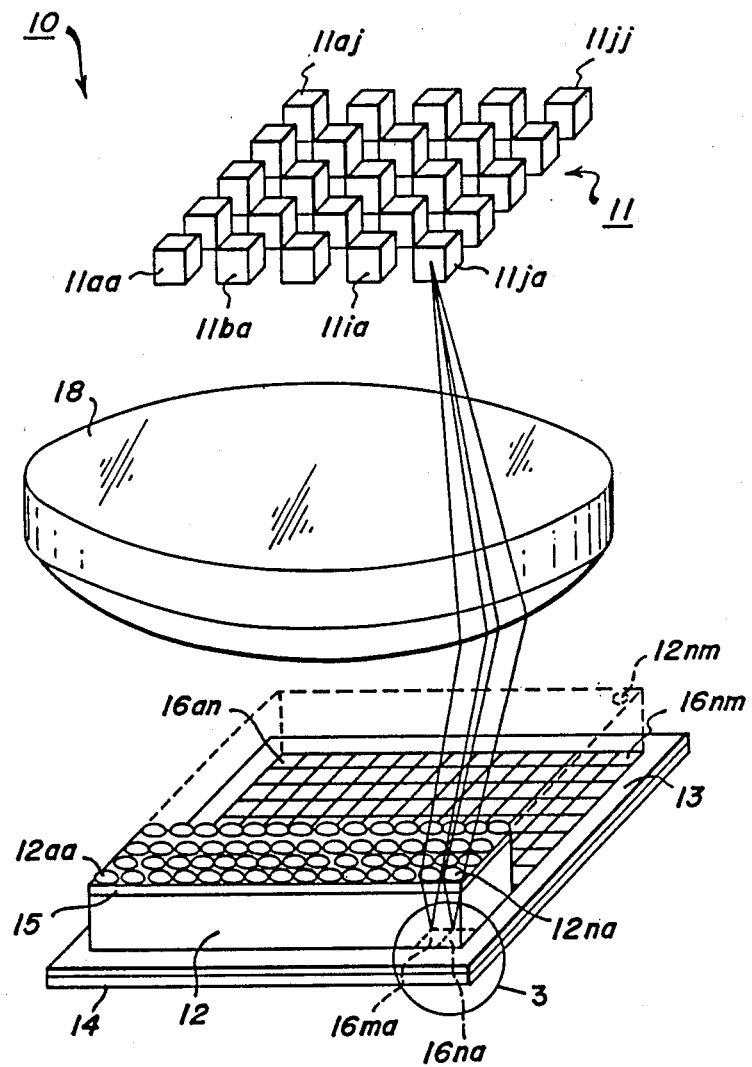
FIG. 1 is a simplified isometric view of a block oriented solid state optical memory constructed in accordance with the present invention.
Figure 2:
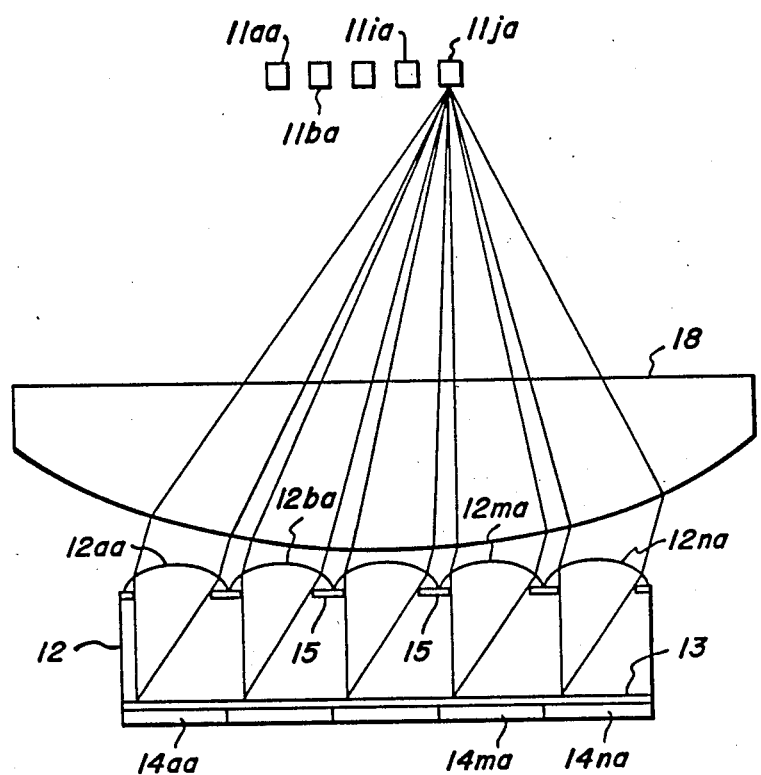
FIG. 2 is a schematic sectional view of the memory shown in FIG. 1.

Turning now to the drawings, and at this point especially to FIGS. 1 and 2, there is a solid state optical memory 10 comprising a photoemitter array 11, a lens array 12, a data mask 13 and a photodetector array 14, which reside in substantially parallel planes. As illustrated, the photoemitter array 11 is a two dimensional, planar array of selectively energizeable light emitting diodes (LEDs) 11$aa$–11$jj$, and the photodetector array 14 is a two dimensional, planar array of photodiodes or other photosensitive elements 14$aa$–14$nn$. For example, the photodetector array 14 may be a more or less conventional silicon RAM device, stripped of its usual light shield and fabricated to have expanded drain capacities. Two dimensional photoemitter and photodetector arrays are used to increase the storage capacity of the memory 10, but linear arrays could be employed if desired. Planar arrays are favored because of their commercial availability and their ease of application. To simplify this disclosure, a straightforward convention has been employed, whereby features of the memory 10 that depend on the size of photoemitter array 11 are identified by reference numerals having the same alphabetical suffixes as the photoemitters 11$aa$–11$jj$, while those that depend on the the size of the photodetector array 14 are identified by reference numerals having the same alphabetical suffixes as the photosensors 14$aa$–14$nn$. Since two dimensional photoemitter and photodetector arrays are preferred, the first and second letters of each suffix represent colummn and row locations, respectively.

In accordance with the present invention, the lens array 12 has a plurality of laterally separated lenslets 12$aa$–12$nn$ on its first surface for focusing essentially diffraction limited images of the photoemitter array 11 in parallel onto laterally displaced sections of the data mask 13, so that the images optically align with the photosensors 14$aa$–14$nn$, respectively. To simplify the fabrication of the lens array 12, the lenslets 12$aa$–12$nn$ are hemispherical, so there also is an opaque light shield 15 on the first surface of the lens array 12 for optically masking the area between them, thereby reducing the amount of unwanted stray light that is incident on the data mask 13. To ensure that the apertures of the lenslets 12$aa$–12$nn$ are more or less optically equidistant from the data mask 13, the lens array 12 has a generally uniform optical thickness.

The data mask 13 is patterned to have a data dependent optical transmission profile, which usually is determined by the lateral distribution of the small holes (not shown) that are formed therein to store binary bits of one logic level, say, "1," and of the opaque areas that remain to store bits of the opposite or "0" logic level. Thus, to facilitate the optical addressing of the data, the data mask 13 is sandwiched between the last surface of the lens array 12 and the upper or photosensitive surface of the photodetector array 14. Indeed, the data mask 13 preferably is immediately adjacent, or in intimate contact with, the lens array 12 and the photodetector array 14 to reduce the lateral scaterring of reflected light.

Figure 3:
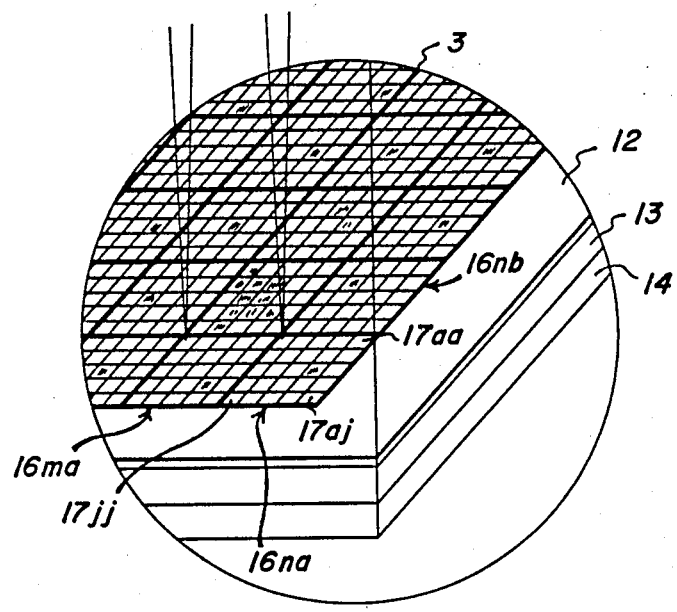
FIG. 3 is a fragmentary magnified view of the enclosed area 3 in FIG. 1 to illustrate a representative portion of the memory in additional detail.

As most clearly shown in FIG. 3, the parallel imaging of the photoemitter array 11 onto the data mask 13 optically partitions the memory 10 to define a plurality of spatially displaced "memory sectors" 16$aa$–16$nn$, each of which is optically subdivided to contain a plurality of selectively addressable "memory cells" 17$aa$–17$jj$. Thus, in keeping with this invention, essentially diffraction limited images of the photoemitter array 11 are formed on the data mask sections 13$a$–13$n$, so that the permissible bit storage density of each of the memory sectors 16$a$–16$n$ is substantially maximized. As will be appreciated, the center-to-center spacing of the photosensors 14$aa$–14$nn$ dictates the maximum permissible packing density of the memory sectors 16$aa$–16$nn$, so this invention effectively maximizes the permissable bit storage density of the memory 10 within the constraints imposed by existing semiconductor technology.

More particularly, if it is assumed that the lenslets 12$aa$–12$nn$ are free of geometric abberations, the diffraction limited diameter for the spot illuminated by light brought to focus by any one of them may be expressed by reference to the width d of the focused spot at its first zero or null point (the spot has a $(\sin x/x)^2$ intensity profile) as follows:

$$d = 1.22\lambda/n \cdot NA \qquad (1)$$

where:

$\lambda$ = the wavelength of the light in air;

n = the index of refraction of the lens array 12; and

NA = the numerical apertures of the lenslets 12$aa$–12$nn$ (assuming that the data mask 13 is in intimate contact with the last surface of the lens array 12).

This relationship may be used, for example, to calculate the theoretical diffraction limited spot size for a miniaturized version of the memory 10 wherin the lenslets 12$aa$–12$nn$ are complete hemispheres having radii of 15 microns or so and are positioned so that their apertures are spaced roughly 3 cm. from the plane of the photoemitter array 11. Under those circumstances, the lenslets 12$aa$–12$nn$ have a numerical aperture of nearly 0.63. If it is assumed for purposes of this example that the light emitted by photoemitters 11aa–11jj has a predominant wavelength of about 710 nm. and that the refractive index of the lens array 12 at that wavelength is 1.5 or so, equation (1) can be solved using the aforementioned numerical aperture value to show that the theoretical diffraction limited spot size for the above-described embodiment of the memory 10 is about 0.92 microns.

Unfortunately, the geometrical abberations of the lenslets 12aa–12nn seldom can be ignored in practice. For example, in the relatively simple case of an on-axis image, they scale as a function of the square of the focal lengths of the lenslets 12aa–12nn. Thus, they usually are significant, even in miniaturized memories, where those focal lengths are as short as 25–50 microns. Accordingly, to carry out the invention, the light shield 15 extends into the apertures of the lenslets 12aa–12nn to stop them down sufficiently to approximate diffraction limited performance. As used herein, "diffraction limited performance is approximated" and the images formed on the data mask 13 are "essentially diffraction limited" when the apertures of the lenslets 12aa–12nn are substantially at the maximum diameter that causes diffraction off them to determine the first zero or null diameters of the focused light falling on the rear focal plane of the lens array 12 (i.e., the data mask 13). Wider apertures allow the geometrical abberations of the lenslets 12aa–12nn to determine the imaging resolution, while narrower apertures increase the diffractive dispersion of the focused light. For example, diffraction limited performance is approximated in the aforementioned miniaturized version of the memory 10 if the apertures of the lenslets 12aa–12nn are stopped down to a numerical aperture of about 0.29. Equation (1) yields a diffraction limited spot size of approximately 2.2 microns when it is solved using that reduced numerical aperture value, and encircled energy calculations (calculations showing the percentage of focused light rays falling within a circle of predetermined diameter) confirm that virtually all rays from all field positions across the stopped down aperture of any of the lenslets 12aa–12nn fall within a 2.2 micron diameter circle on the data mask 13. Of course, the foregoing empirical process can be employed to determine the numerical aperture required for diffraction limited performance of the lenslets 12aa–12nn in other embodiments of the memory 10, so the foregoing example merely illustrates a representative application of the process.

In view of the usual collection efficiency of the lenslets 12aa–12nn, the photoemitter array 11 suitably is a 16×16 LED array embodying commercially available LED devices on customary center-to-center spacings. Accordingly, the memory 10 may be constructed to have 256 selectively addressable memory cells 17aa–17jj in each of the memory sectors 16aa–16nn. The photodetector array 14, on the other hand, typically is a more or less conventional 64K silicon device having 256×256 photosensitive elements 14aa–14nn on standard center-to-center spacings. Thus, it will be understood that the memory 10 may contain slightly more than 64,000 laterally distributed memory sectors 16aa–16nn. In other words, existing photoemitter and photodetector technology may be employed to construct the memory 10 so that it has sufficient capacity to store up to 256 separately addressable data blocks, each of which may contain up to 64,000 or so individual bits. That, in turn, means that the memory 10 may be readily designed to have a total bit capacity of approximately 16.8 Mbits. Moreover, it can be shown that the external dimensions of such a memory need not be much greater than $1'' \times 1'' \times 1''$.

To accomodate the distributed data storage architecture of the memory 10, data blocks are mapped onto the data mask 13 in accordance with a mapping pattern which distributes the bits of each data block across the memory sectors 16aa–16nn on a single bit/sector basis, so that they reside within the memory cells 17aa, 17ba, ... or 17jj which are illuminable by a respective one of the photoemitters 11aa, 11ba, ... or 11jj. In operation, no more than one of the photoemitters 11aa–11jj is energized at any given time, thereby allowing a predetermined one of the memory cells 17aa, 17ba, ... or 17jj within each of the memory sectors 16aa–16nn to be illuminated or "optically addressed" whenever one of the photoemitters 11aa, 11ba, ... or 11jj is energized. That, in turn, causes the photosensors 14aa–14nn to accumulate charges corresponding to the individual bits of a selected data block.

All of the bits of an optically addressed data block can be retrieved by reading out all of the photosensors 14aa–14nn after an appropriate charge accumulation period or "data access time," which usually is on the order of 10–100 microseconds or longer. As a general rule, however, the data blocks are organized to permit shorter related groups of bits to be selectively stripped therefrom, such as by selectively addressing the photosensors 14aa–14nn. For example, addressing electronics (not shown) suitably are provided for selectively addressing the detector elements 14aa–14nn on a row-by-row or a column-by-column basis, thereby permitting data segments having a length of 256 bits to be read out on demand from, say, a 256×256 photodetector array 14. Furthermore, each of those data segments might also be organized so that even shorter, word length groups of bits, such as standard 32 bit or 64 bit long data words, can be selectively recovered therefrom, but such "post read-out" processing of the data is beyond the scope of this disclosure.

As will be evident, the distributed data storage architecture of memory the 10 significantly reduces the probability that minor electrical or optical defects in its construction or operation will cause burst errors of troublesome length or frequency to appear in the data retrieved therefrom. For example, a total failure of one of the photosensors 14aa–14nn might be responsible for producing a single, isolated bit error in at least some of the output data, but that single failure would not create any burst errors. Localized optical defects which optically mask some the bits stored on the data mask 13 might in theory cause some burst errors. However, the area over which the bits of each data block are distributed is so large relative to the size the optical defects which are likely to exist in practice that the burst errors, to the extent that there are any, are likely to involve only a very few bits.

Nevertheless, error correction may be desired under some circumstances. It, therefore, should be understood that the data may be encoded (by means not shown) in accordance with an error correction code, such as a conventional Hamming code, prior to being stored in the memory 10. Moreover, if error correction is employed, it may be desireable to modify the configuration of the photodetector array 14, so that it has dedicated storage elements (not shown) for storing the parity bits used for error correction purposes. For example, if the data is organized to be selectively addressed in 256 bit long data segments (each of which contains four 64 bit data words) and if seven parity bits are required for each data word, the photodetector array 14 advantageously has 284 detector/storage elements along each of its electrically addressable rows or columns. Of course, the number of photodetectors along the other or non-electrically addressable axis of the array 14 might be reduced somewhat to leave sufficient space for integrating at least a portion of the readout electronics (also not shown) with the array 14 through the use of conventional very large scale integrated (VLSI) circuit technology.

As shown, the lenslets 12aa–12nn are essentially centered on the photosensors 14aa–14nn, respectively. However, each of the photoemitters 11aa–11jj occupies a unique lateral position with respect to each of the lenslets 12aa–12nn. Thus, in the absence of suitable optical correction, the images focused onto the data mask 13 would tend to have their centers shifted by different amounts with respect to the centers of the photosensors 14aa–14nn, respectively, and to have non-uniform magnifications widthwise and depthwise of the data mask 13. This lateral distortion is undesireable because it causes mis-centering of the memory sectors 16aa–16nn with respect to the photosensors 14aa–14nn, respectively, and irregular spacing of the memory cells 17aa–17jj within each of the memory sectors 16aa–16nn.

While the positioning of the bits stored on the data mask 13 could be appropriately adjusted while the data is being mapped into the memory 10 to account for the lateral distortion, the preferred solution is to optically correct for it. To that end, the photoemitter array 11 is located in the front focal plane of a collimating lens 18 which substantially collimates the light emitted by each of the photoemitters 11aa–11jj before it reaches the lens array 12. Thus, whenever one of the photoemitters 11aa–11jj is energized, the light emitted thereby passes through the apertures of all of the lenslets 12aa–12nn at substantially the same, unique angle. Consequently, the images focused onto the data mask 13 are essentially centered on the photosensors 14aa–14nn, respectively, and have substantially constant magnifications widthwise and depthwise thereof. To provide the appropriate correction for the lateral distortion at all positions across the full width and depth of the memory 10, the collimating lens 18 typically is a multi-element lens or an aspheric.

CONCLUSION

In view of the foregoing, it will now be understood that the present invention provides a high resolution imaging system for optically addressing data stored in block oriented solid state optical memories having distributed data storage architectures. As will be appreciated, such an imaging system is especially important for memories containing very densely compacted data, such as miniaturized memories and larger, high capacity memories. While certain features of the invention are most clearly relevant to miniaturized memories, it will be evident that the broader aspects of the invention are not limited thereto.

What is claimed is:

1. In a solid state optical memory having a photoemitter array including a plurality of selectively and individually energizeable photoemitters, a photodetector array including a plurality of photosensors, and a data mask optically interposed between said photoemitter and photodetector arrays; the improvement comprising a lens array located between said photoemitter array and said data mask, said lens array including a plurality of spatially separated lenslets for focusing plural, spatially separated images of said photoemitter array in parallel onto said data mask, said images being optically aligned with respective ones of said photosensors and having sufficient resolution to separately resolve each of said photoemitters, whereby said memory is opticaly partitioned into a plurality of spatially displaced memory sectors and each of said memory sectors is optically subdivided into a plurality of selectively illuminable memory cells, said lenslets having apertures selected so that said images are essentially diffraction limited, whereby said memory sectors are finely subdivided for the storage of relatively densely compacted data.

2. The improvement of claim 1 wherein said lenslets are substantially hemispherical and are formed on a first surface of said lens array, an opague light shield on the first surface of said lens array optically masks areas between said lenslets to eliminate stray light, and said data mask is adjacent a last surface of said lens array.

3. The improvement of claim 2 wherein said light shield extends into the apertures of said lenslets to stop them down, thereby causing said lenslets to achieve substantially diffraction limited performance.

4. The improvement of claim 3 wherein bits of multi-bit data blocks are mapped onto said data mask in accordance with a mapping pattern selected to locate the bits of each of said data blocks in memory cells which are selectively illuminable by a respective one of said photoemitters, said bits have binary values, and said data mask has an optical transmission profile patterned in accordance with the values of the bits mapped thereon, whereby said photosensors accumulate the binary values of the bits of a selected data block whenever one of said photoemitters is selectively energized.

5. The improvement of claim 4 further including lens means optically interposed between said photoemitter array and said lens array for substantially collimating light emitted by each of said photemitters, thereby correcting for lateral distortion of said images.

6. The improvement of claim 1 wherein said lenslets are formed on a first surface of said lens array, said data mask is in intimate contact with a last surface of said lens array, and said lens array has a substantially uniform optical thickness, so that the apertures of said lenslets are substantially equidistant from said data mask.

7. The improvement of claim 6 wherein said lenslets are substantially hemispherical, and said lens array further includes an opague light shield on its first surface for blocking stray light falling between said lenslets.

8. The improvement of claim 7 wherein said light shield extends into the apertures of said lenslets to stop them down, thereby causing said lenslets to achieve substantially diffraction limited performance.

9. The improvement of claim 8 wherein
bits of multi-bit data blocks are mapped onto said data mask in accordance with a mapping pattern selected to locate the bits of each of said data blocks in memory cells which are selectively illuminable by a respective one of said photoemitters,
said bits have binary values, and
said data mask has an optical transmission profile patterned in accordance with the values of the bits mapped thereon,
whereby said photosensors accumulate the binary values of the bits of a selected data block whenever one of said photoemitters is selectively energized.

10. The improvement of claim 9 further including
lens means optically interposed between said photoemitter array and said lens array for substantially collimating light emitted by each of said photoemitters, thereby correcting for lateral distortion of said images.

* * * * *